(12) United States Patent
Katori et al.

(10) Patent No.: US 11,493,887 B2
(45) Date of Patent: Nov. 8, 2022

(54) RADIATION SHIELD AND OPTICAL LATTICE CLOCK INCLUDING RADIATION SHIELD

(71) Applicant: RIKEN, Wako (JP)

(72) Inventors: Hidetoshi Katori, Wako (JP); Masao Takamoto, Wako (JP); Ichiro Ushijima, Wako (JP); Takehiro Tawara, Wako (JP); Hideo Yokota, Wako (JP)

(73) Assignee: RIKEN, Saitama (JP)

( * ) Notice: Subject to any disclaimer, the term of this patent is extended or adjusted under 35 U.S.C. 154(b) by 966 days.

(21) Appl. No.: 16/251,619

(22) Filed: Jan. 18, 2019

(65) Prior Publication Data

US 2019/0227496 A1 Jul. 25, 2019

(30) Foreign Application Priority Data

Jan. 19, 2018 (JP) .............................. JP2018-007741

(51) Int. Cl.
*G04F 5/14* (2006.01)
*G02B 5/20* (2006.01)
*H03L 7/26* (2006.01)

(52) U.S. Cl.
CPC ............... *G04F 5/14* (2013.01); *G02B 5/208* (2013.01); *H03L 7/26* (2013.01)

(58) Field of Classification Search
CPC ...................................... G04F 5/14; H03L 7/26
See application file for complete search history.

(56) References Cited

U.S. PATENT DOCUMENTS

2015/0194972 A1 7/2015 Katori
2016/0013795 A1 1/2016 Sastrawan et al.

FOREIGN PATENT DOCUMENTS

WO 2014/027637 A1 2/2014
WO 2016/122001 A1 8/2016

OTHER PUBLICATIONS

Beloy, K., et al. "Atomic clock with 1× 10-18 room-temperature blackbody stark uncertainty." Physical review letters 113.26 (2014): 260801. (Year: 2014).*

(Continued)

*Primary Examiner* — Ryan Johnson
(74) *Attorney, Agent, or Firm* — Seed IP Law Group LLP

(57) ABSTRACT

Provided according to an embodiment of the present disclosure is a radiation shield 10 including a shield wall surrounding a hollow region capable of accommodating therein atoms for an optical lattice clock 100, the shield wall having, provided therein, at least two apertures communicating with outside. A geometrical shape of an inner wall surface of the shield wall is configured such that a difference between BBR shifts found under two conditions does not exceed a predetermined value over a range of position of atoms, the BBR shifts being caused in atoms 2 by emitted radiation emitted by the inner wall surface, incoming radiation leaking in from the outside through the apertures, and a reflection component of the emitted radiation and incoming radiation at the inner wall surface, the two conditions being a condition where the inner wall surface exhibits mirror reflection and a condition where the inner wall surface exhibits diffuse reflection, the range being where clock transition operation is carried out in the optical lattice clock, the inner wall surface facing the hollow region. Provided according to other embodiments of the present disclosure also are the optical lattice clock 100 including such a radiation shield, and a design method for the radiation shield.

11 Claims, 10 Drawing Sheets

(56) References Cited

OTHER PUBLICATIONS

Mizuno, Kohei, et al. "A black body absorber from vertically aligned single-walled carbon nanotubes." Proceedings of the National Academy of Sciences 106.15 (2009): 6044-6047. (Year: 2009).*

Middelmann et al., "Tackling the blackbody shift in a strontium optical lattice clock," *IEEE Transactions on 60*, 2550, 2011, (7 pages).

Ushijima et al., "Cryogenic optical lattice clocks," *Nature Photonics* 9:185-189, 2015. (5 pages).

Pharr et al., *Physically Based Rendering*: From Theory To Implementation, 3d ed., Morgan Kaufmann Publishers, 2016, Chapter 1, "Introduction".

Pharr et al., *Physically Based Rendering*: From Theory To Implementation, 3d ed., Morgan Kaufmann Publishers, 2016, Chapter 13, "Monte Carlo Integration".

Japanese Office Action, dated Nov. 12, 2021, for Japanese Application No. 2018-007741, 8 pages, (with English, Machine Translation).

Takamoto et al., "Frequency ratios of Sr, Yb, and Hg based optical lattice clocks and their applications," *Comptes Rendus Physique* 16(5):489-498, Jun. 2015.

Takamoto et al., "Optical Lattice Clocks for Precision Time and Frequency Metrology," in Y. Yamamoto et al. (eds.), *Principles and Methods of Quantum Information Technologies*, Lecture Notes in Physics, vol. 911, Springer, Tokyo, 2016, p. 93-110.

\* cited by examiner

RADIATION SHIELD AND OPTICAL LATTICE CLOCK INCLUDING RADIATION SHIELD

BACKGROUND

Technical Field

The present disclosure is related to a radiation shield, and to an optical lattice clock having the radiation shield used therein. More specifically, the present disclosure is related to a radiation shield with reduced influence of blackbody radiation affecting atoms, and to an optical lattice clock having the radiation shield used therein.

Description of the Related Art

Various atomic clocks, particularly optical atomic clocks, have been conventionally developed for highly accurate time measurement. In particular, for an optical lattice clock where an optical lattice that is a standing wave of light is realized by laser of a magic wavelength, operation with a reduced uncertainty of the $10^{-18}$ level in clock transition frequency has been demonstrated by a technique where atoms are confined by the optical lattice in a spatial region sufficiently small as compared to the wavelength of the clock laser. One of major factors determining this uncertainty is light shift by the optical lattice confining the atoms. The light shift is able to be reduced by, for example, improvement made by inventors of the present disclosure (Patent Document 1). Another factor determining the uncertainty is blackbody radiation (BBR), that is, the Stark shift arising from blackbody radiation (BBR shift) having its origin in a radiation field governed by Stefan-Boltzmann Law. For example, it has been known that the clock frequency of an optical lattice clock having neutral strontium atoms (Sr) used therein shifts at $10^{-14}$ due to blackbody radiation at room temperature. For this influence of the blackbody radiation to be reduced, reducing the radiation energy itself by cooling the ambient environment of the atoms to a very low temperature is effective, so the radiation energy being proportional to the fourth power ($T^4$) of the temperature T. Adopting a coolable shielding member (a radiation shield) is found effective to some extent, in which atoms that undergo state transition (clock transition) for spectroscopy is arranged for realizing cryogenic ambient environment around the atoms. For example, a Sr optical lattice clock, which has: a radiation shield cooled to 95 K; reduced blackbody radiation caused inside thereof; a black body radiation induced uncertainty of $0.9 \times 10^{-18}$; and a total uncertainty of $8.2 \times 10^{-18}$, has been reported (Non-Patent Document 1).

CITATION LIST

Patent Documents

Patent Document 1: WO 2016/122001

Non-Patent Documents

Non-Patent Document 1: Ichiro Ushijima, Masao Takamoto, Manoj Das, Takuya Ohkubo, and Hidetoshi Katori, "Cryogenic optical lattice clocks," Nature Photonics 9, 185-189 (2015), doi:10.1038/nphoton.2015.5
Non-Patent Document 2: T. Middelmann, C. Lisdat, S. Falke, J. Winfred, F. Riehle, and U. Sterr, "Tackling the blackbody shift in a strontium optical lattice clock," IEEE Transactions on 60, 2550 (2011), doi:10.1109/TIM.2010.2088470

Although the uncertainty of the frequency on clock transition has achieved the $10^{-18}$ level, there is a demand for time measurement at an uncertainty of the $10^{-19}$ level surpassing the $10^{-18}$ level or at higher accuracy. Therefore, there is still room for further improvement of reducing BBR shift.

Radiation shields for optical lattice clocks each have at least two apertures for allowing introduced atoms and laser beams for its optical lattice and for clock transition to be interrogated inside the radiation shield. Since the space outside the wall (the shield wall) serving as the radiation shield is typically filled with blackbody radiation according to room temperature, room temperature radiation leaks into the radiation shield through these apertures. Since the room temperature radiation energy has a magnitude according to $T^4$, even if the size of the apertures themselves is made as small as possible, influence of the room temperature radiation energy is not negligible. If an absorbing material is disposed on the inner wall surface of the shield wall, the influence of blackbody radiation leaking in is able to be reduced to some extent, but absorption by a low reflection coating actually adoptable is not necessarily perfect, and the low reflection coating may still have a reflectance of, for example, about 10%. Electromagnetic waves not absorbed at the inner wall surface cause multiple reflection, but influence thereof has not been considered thus far. What is troublesome is diffusibility that accompanies reflection in actual low reflection coatings, and to make matters worse, characteristics of such diffuse reflection are often unknown; thus a lot of trouble is taken for granted when designing radiation shields in consideration of correct reflection characteristics.

An object of the present disclosure is to solve at least one of the above described problems. By provision of a radiation shield designed based on novel conception, and an optical lattice clock having the radiation shield used therein; the present disclosure contributes to further development of the time measurement technology.

BRIEF SUMMARY

The inventors have found a new design technique for a radiation shield in consideration of radiation (electromagnetic waves mainly in the infrared region) leaking into the radiation shield from the outside through apertures thereof. They have also taken steps to confirm that the radiation shield based on this design technique enables further reduction in uncertainty of clock transition of the optical lattice clock, which findings and steps are set forth in this disclosure.

According to an aspect of the present disclosure a radiation shield is provided. This radiation shield includes a shield wall surrounding a hollow region configured to accommodate therein atoms for an optical lattice clock. The shield wall has an inner wall surface. The shield wall has, provided therein, at least two apertures providing for communicating with outside. These two apertures permit communicating to and from the hollow region with the outside. A geometrical shape of an inner wall surface of the shield wall is configured such that a difference between blackbody radiation (BBR) shifts found under two conditions does not exceed a predetermined value at each position of the atoms.

The BBR shifts being caused in clock transition of the atoms by the radiation emitted by the inner wall surface, incoming radiation leaking in from the outside through the apertures, and a reflection component of the emitted radiation and incoming radiation at the inner wall surface, the two conditions being a condition where the inner wall surface exhibits mirror reflection and a condition where the inner wall surface exhibits diffuse reflection, the less dependence of inner wall surface characteristics in the two conditions over a long range of position, the each position being where clock transition operation is carried out in the optical lattice clock, the inner wall surface facing the hollow region.

In addition, provided according to the present disclosure is an optical lattice clock having the radiation shield according to the above aspect. Furthermore, according to the present disclosure, a design method for the radiation shield is also provided.

A shield wall of a radiation shield generally has two apertures for implementation of an optical lattice clock. In a hollow region in the radiation shield, the radiation emitted by the inner wall surface of the shield wall, incoming radiation leaking in from the outside through the apertures, and radiation of a component resulting from reflection of the emitted radiation, which influences the transition frequency of atoms as BBR shift. According to the above aspect of the present disclosure, the BBR shift is caused in the clock transition under the two conditions are respectively found, the two conditions being the condition where the inner wall surface exhibits mirror reflection and the condition where the inner wall surface exhibits diffuse reflection. When the amount of BBR shift in consideration of the actual inner wall surface are found, detailed characteristics of the reflection at the inner wall surface (how much diffusion is caused upon reflection and whether scatter is caused) do not need to be known, and for example, only the reflectance (a fraction reflected as energy) needs to be known. For a model of the inner wall surface for the calculation of the BBR shift, virtual reflecting surfaces are assumed to be a perfect diffuse reflection surface having a value of the reflectance and a mirror reflection surface having the value of the reflectance. A difference found from the two BBR shifts calculated on that assumption is found at each of the positions of the atoms for clock transition, and is compared with a predetermined value. If a geometrical shape of the inner wall surface of the shield wall, for which the difference between the shift does not exceed the predetermined value in this comparison, is obtained, that geometrical shape will have sufficient performance even if the geometrical shape is of an actual inner wall surface, for which details of its reflection characteristics have not necessarily been known.

The inner wall surface according to the above aspect of the present disclosure is a range of a surface of the shield wall, the range facing the hollow region surrounded by the shield wall. If a layer, a film, or the like has been provided on the shield wall as a coating, the inner wall surface should be a surface of that coating. The shield wall is made of, for example, a metal (such as copper) high in thermal conductivity so that the shield wall is able to be homogeneous in temperature. Furthermore, in the description of this patent application, a numerical value of uncertainty is written with a range of uncertainty that is included in the last digit of the numerical value, the range being written in brackets immediately after the numerical value. According to this notation, for example, "0.20(1)" means that an uncertainty of about "1" written in the brackets is expected in the hundredths place that is the last digit of the value, "0.20", immediately before the brackets. That is, this example may be expressed as "0.19 to 0.21" in a range format having an upper limit and a lower limit. However, the indication of an uncertainty in such a numerical representation only means that the value numerically represented and the error accompanied by that value are essentially statistical, and does not mean that the value represented is always limited to that range. Including these terms and notation, terminology following the common use in the technical field that the present disclosure belongs to may be adopted in this patent application unless the adoption thereof renders the present disclosure unclear. For example, a beam of radiation caused by heat source that is in the infrared region may be called a ray, and terms related to blackbody radiation may be used for actual radiation that is not necessarily ideal blackbody radiation.

Provided according to an aspect of the present disclosure are: a radiation shield that enables reduction of uncertainty to about $10^{-19}$ or less by elimination of influence of radiation on Sr atoms as much as possible, which is extended for other atomic species like Yb, Mg, Cd and Hg; and an optical lattice clock having the radiation shield adopted therein.

BRIEF DESCRIPTION OF THE SEVERAL VIEWS OF THE DRAWINGS

FIG. 1A is a radiation shield model having two apertures, FIG. 1B is a path tracing model calculated by a Monte Carlo method, and FIG. 1C is a schematic diagram illustrating diffuse reflection and mirror reflection.

FIG. 4A is a rendering of the conventional radiation shield illustrated as an example. FIG. 4B is a graph illustrating results of calculation of BBR shift obtained on the assumption that the inner wall surface has a low reflection coating formed thereon and exhibits two types of reflection, diffuse reflection in filled squares and mirror reflection in open circles. FIG. 4C is a graph illustrating the BBR shift difference from one for atoms at an assumed position (z=10 mm) at the time of spectroscopy.

DETAILED DESCRIPTION

Figure 1A:
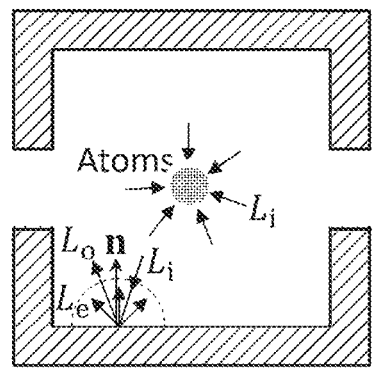
FIG. 1A to FIG. 1C are explanatory diagrams illustrating elements to be considered in calculation according to an embodiment of the present disclosure, where

Hereinafter, by reference to the drawings, embodiments of a radiation shield and an optical lattice clock, according to the present disclosure, will be described. In the description, unless particularly stated, any common part or element will be assigned with a common reference sign, throughout the drawings. Furthermore, scale ratios are not necessarily maintained among elements of the embodiments illustrated in the drawings.

1. Design of Radiation Shield

The uncertainty of BBR shift estimated as a calculation for a radiation shield adopted in a conventional Sr optical lattice clock is $0.9 \times 10^{-18}$ (Non-Patent Document 1 cited above). This calculation is estimated from the solid angle extended by the apertures and measurement of the environmental temperature. For more precise calculation, additional shift must be considered carefully, the additional shift being caused by both multiple reflection, and scattering caused at the inner wall surface of the shield wall after leakage into the shield from the environment. Estimation of the BBR shift in Non-Patent Document 1 is based on use of a simple spherical model for the radiation shield. According to embodiments of the present disclosure, for effects of multiple reflection to be treated more precisely, influence of geometrical shapes, reflectance values, and reflection characteristics of inner wall surfaces of shields are considered by employment of a ray tracing method.

Specifically, described according to the embodiments is ray tracing calculation for BBR shifts induced by thermal radiation inside radiation shields. This calculation model is applied to the geometrical design of the radiation shield adopted in Non-Patent Document 1. Optimal geometrical shapes of radiation shields for realization of optical lattice clocks with BBR uncertainties of $10^{-19}$ for Sr atoms will also be described. With improvement of the evaluation method for the lattice light shift due to an optical lattice, a cryogenic optical lattice clock with a total uncertainty of $10^{-19}$ will be realized.

1-1. Calculation Model

Figure 1B:
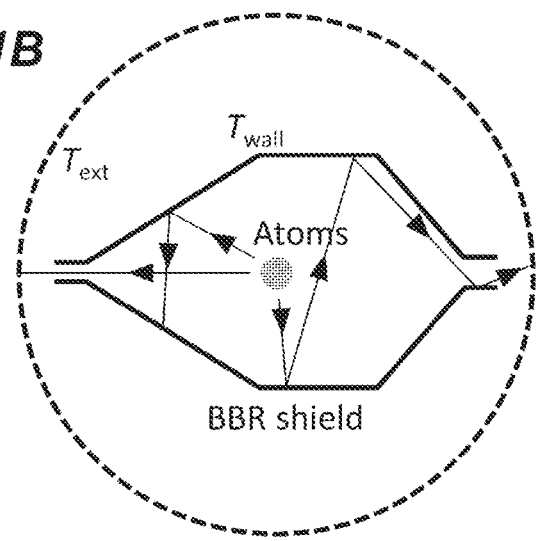
Figure 1C:
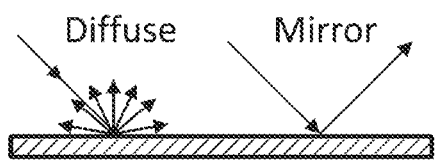

FIG. 1A to FIG. 1C are explanatory diagrams illustrating elements to be considered in calculation according to an embodiment of the present disclosure, and FIG. 1A is a radiation shield model having two apertures, and illustrates three components of radiation that the atoms are irradiated with in a ray tracing algorithm. In FIG. 1A, $L_e$ is the emitted radiance emitted by the inner wall surface, $L_i$ is the incoming radiance, and $L_o$ is the outgoing radiance. FIG. 1B is a path tracing model calculated by a Monte Carlo method. FIG. 1C is a schematic diagram illustrating perfect diffuse reflection and mirror reflection.

As illustrated in FIG. 1A, for the atoms in the shield with the apertures, reflected rays and scattered rays of thermal radiation reflected and scattered by the inner wall surface with a reflectance need to be considered, in addition to rays leaking in through the apertures and rays emitted from the inner wall surface of the shield with an emissivity. By using the emissivity $\varepsilon(\nu)$ of inner wall surface, its reflectance $R(\nu)$ is defined by $R(\nu)=1-\varepsilon(\nu)$. This $\nu$ represents frequency of radiation. Such an indirect component of the BBR shift due to multiple reflection is an important contributing factor for a clock uncertainty for Sr and Yb that have large sensitivity to thermal radiation.

A BBR shift is a frequency shift caused by a difference between Stark shifts in a ground state and an excited state of clock transition, the Stark shifts being caused by reception of energy of thermal radiation that the atoms are irradiated with. A thermal electric field $E(\nu, T)$ due to blackbody radiation generated from a thermal source at a temperature T may be defined as follows per unit frequency range $d\nu$ of frequency $\nu$ of blackbody radiation.

$$E^2(\nu, T) = \frac{8\pi h}{\varepsilon_0 c^3} \frac{\nu^3}{e^{h\nu/k_B T} - 1}, \tag{1}$$

In Equation 1, h is the Planck constant, $\varepsilon_0$ is the electric constant, and $k_B$ is the Boltzmann constant. By use of Equation 1, the BBR shift is written as expressed by Equation 2 below.

$$\nu_{BBR}(T) = -\frac{1}{4h} \times \int_0^\infty \Delta\alpha(\nu) E^2(\nu, T) d\nu, \tag{2}$$

In Equation 2, $\Delta\alpha(\nu)$ is a difference between polarizabilities of the ground and excited states of clock transition. In Equation 2, the magnetic-dipole and higher-order multipole contributions have been neglected.

Here, the spectral irradiance of thermal radiation at a position $r_a$ of the target atoms is calculated by considering spatial inhomogeneity in temperature. As the mm-scale of the shield significantly exceeds the wavelength (of up to μm) of thermal radiation, the spectral radiance propagated along straight lines (rays) in vacuum is considered. For accurate evaluation of the BBR shift induced by thermal radiation $\nu_{th}(r_a)$, which explains the spatial inhomogeneity, a ray tracing method is employed for integration of radiation rays over the sphere surrounding the atoms.

For the atoms inside the shield with the apertures as illustrated in FIG. 1A, the rays of thermal radiation reflected and scattered by the inner wall surface having the reflectance $R(\nu)$ must be considered in addition to the incoming rays leaking in through the apertures and the emitted rays from the inner wall surface of the radiation shield with the emissivity of $\varepsilon(\nu)$. Such an indirect component of the BBR shift due to the multiple reflection is an important contributing factor for reduction of the clock uncertainty to the low $10^{-19}$ level.

1-2. Monte Carlo Ray Tracing Calculation Method

A Monte Carlo ray tracing calculation method is a stochastic approach for light propagation in a space to be solved. In a real environment, light is emitted from a light source, is reflected by a surface, and reaches target atoms. However, most of the rays emitted from the light source do not hit the atoms after multiple reflection. Therefore, for calculation efficiency, the backward approach where the rays are traced back from positions of the target atoms to the light source is adopted as a ray tracing algorithm.

The inventors use a path tracing algorithm where the backward Monte Carlo ray tracing is applied, for calculation of effects of reflection and scatter of light. Any sort of shapes and materials, and light of desired frequencies may be handled according to this algorithm. The inventors employ open source ray tracing software called "pbrt—a physically based ray tracer" for actual path tracing (www.pbrt.org). The comprehensive theory and complete implementation details of the Monte Carlo ray tracing are described in a book (Matt Pharr, Wenzel Jakob, and Greg Humphreys, "Physically Based Rendering, Third Edition: From Theory to Implementation," Morgan Kaufmann (2016), ISBN-13: 978-0128006450).

The following is a brief description of the path tracing algorithm. FIG. 1B will be used for explanation of the algorithm. Firstly, one ray per path is traced from the target atoms toward a randomly selected direction. When the ray hits a surface, whether the ray will be absorbed or reflected is probabilistically determined based on the reflectance of the inner wall. If the ray gets reflected, a new direction is probabilistically selected based on the bidirectional reflectance distribution function (BRDF) of the surface. The ray is traced until the ray is completely absorbed by the surface or reaches outside the radiation shield.

A rendering equation is an integral equation describing light propagation in the ray tracing algorithm. This integral equation is evaluated at every location on a surface hit by a ray, and is expressed by Equation 3 below.

$$L_o(r,v,e_o)=L_e(r,v,e_o)+\int_{\Omega_r} f(r,v,e_i,e_o) L_i(r,v,e_i)(n \cdot e_i) de_i, \quad (3)$$

In Equation 3, $L_e$ is the emitted spectral radiance, $L_i$ is the incoming spectral radiance, $L_o$ is the outgoing spectral radiance, f is the BRDF, $\Omega_r$ is the hemisphere at the location r, $e_i$ is the negative direction of the incoming light, $e_o$ is the outgoing light direction, and n is the unit vector perpendicular to the reflecting surface.

Although any BRDFs may be handled with this path tracing algorithm, the inventors were unable to confirm the energy conservation law for some BRDFs in the implementation of "pbrt". Therefore, the inventors use a perfect diffuse reflection model and a perfect mirror reflection model, for which the inventors have confirmed the energy conservation law, as reflection models of a radiation shield in this patent application.

FIG. 1C illustrates these two models. In the perfect diffuse reflection model, the reflecting surface is assumed to be a surface following Lambert's Law. Light is uniformly reflected in the hemispherical direction regardless of the incoming direction. In the perfect mirror reflection model on the other hand, the angle of reflection becomes equal to the angle of incidence.

The BBR shift due to the thermal radiation $v_{th}(r_a)$ may be calculated by integration of the incoming spectral radiance.

$$v_{th}(r_a) = -\frac{1}{4h} \times \int_0^\infty \Delta\alpha(v) \times \left( \frac{1}{c} \int_{\Omega_{ra}} L_i(r_a, v, e_i) de_i \right) dv. \quad (4)$$

In this patent application, two different light sources (thermal sources) are assumed, one being the room-temperature environment outside the radiation shield at a temperature $T_{ext}$, the other being the inner wall surface of the radiation shield at a temperature of $T_{wall}$.

The inventors define the radiances from the sources as expressed by Equation 5 below.

$$L_r(v, T) = \epsilon(v, T) \frac{c}{4\pi} E^2(v, T) \quad (5)$$

In this patent application, $\epsilon(v, T)$ stands for $\epsilon(v, T_{ext})=1$, or $\epsilon(v, T_{wall})=\epsilon(v)$.) The latter $\epsilon(v)$ is the emissivity of the inner wall surface of the radiation shield. The blackbody radiation is calculated by addition of the two integrated spectral radiance values for $T_{ext}$ and $T_{wall}$ together.

The inventors introduced, in their ray tracing calculation, an omnidirectional camera model where rays are uniformly sampled for all directions. This camera is placed at the position of the target atoms, and a scene surrounded by the radiation shield of the model is rendered (not illustrated in the drawings). The inner wall surface of this radiation shield may be associated with an appropriate number of pixels (for example, an image having two 200×100 squares placed side by side, the squares serving as spherical surfaces). Each pixel value corresponds to a value of the outgoing spectral radiance $L_0$ (Equation 3). The integral equation of Equation 4 is calculated by summation of the reflected radiances represented by these pixel values.

Figure 2:
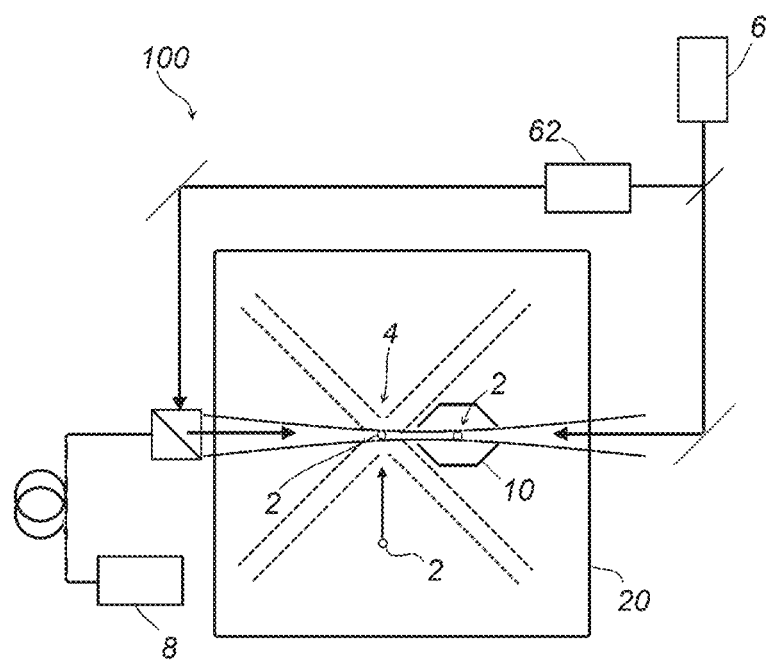
FIG. 2 is an explanatory diagram for a schematic configuration of an optical lattice clock having a radiation shield used therein.
Figure 3:
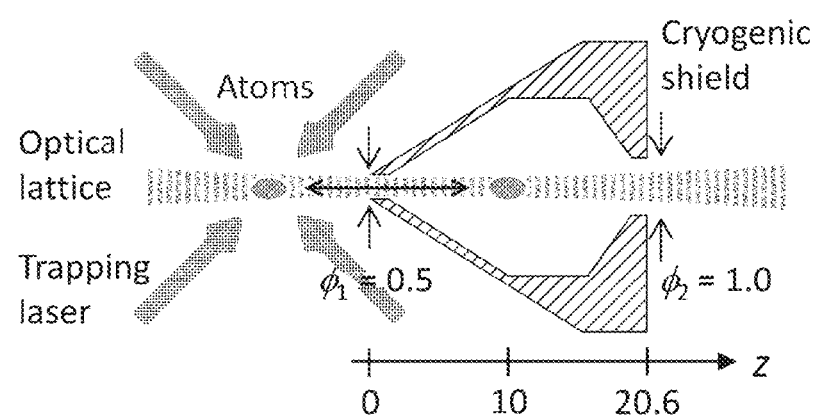
FIG. 3 is a configuration diagram illustrating a layout and a configuration of an optical lattice, atoms, and a radiation shield, of a conventional optical lattice clock.

1-3. Ray Tracing Calculation for Radiation Shield 1-3-1. Cryogenic Optical Lattice Clock FIG. 2 is an explanatory diagram for a schematic configuration of an optical lattice clock having a radiation shield used therein. Furthermore, FIG. 3 is a configuration diagram illustrating a layout and a configuration of an optical lattice, atoms, and a radiation shield, of a conventional optical lattice clock. In a cryogenic optical lattice clock 100, for clock transition spectroscopy of Sr atoms to be performed under a cryogenic environment, a region around the atoms for spectroscopy is surrounded by a radiation shield 10. Atoms 2, such as Sr atoms, are supplied from an atom supply unit, and cooled and trapped by rays of cooling lasers 4 three-dimensionally opposing each other outside the radiation shield 10. Thereafter, the atoms 2 are trapped by an optical lattice formed by an optical lattice laser 6. The optical lattice is a standing wave formed of, for example, counter propagating light beams at the same wavelength (for example, a magic wavelength) configured to pass through the radiation shield 10. The atoms trapped in the optical lattice are able to be precisely transported inside the radiation shield 10 by moving optical lattice, which is performed by modulation of the wavelength of one of the light beams by use of a modulation element 62 capable of wavelength modulation. The atoms 2 are transported by, for example, 10 mm, inside the radiation shield 10, and with the transported atoms 2 still being trapped in the optical lattice formed by the optical lattice laser 6, clock transition is observed by use of an optical means, such as a clock laser 8 at an appropriate position in the radiation shield 10. The above operation of the optical lattice clock 100 is executed in a vacuum chamber 20 having an appropriate volume. Details of the operation of the optical lattice clocks, including those other than that described above, are described in Non-Patent Document 1. In an optical lattice clock where neutral Sr atoms are used; laser cooling and trapping of $^{87}$Sr atoms are performed, the atoms are then loaded into a one-dimensional optical lattice, and a moving optical lattice transports the loaded atoms by 10 mm inside the radiation shield. In FIG. 3, the position of the atoms in the radiation shield is illustrated in units of mm with respect to a z-axis, which: is the central axis of the radiation shield 10; is also the optical axis; and has its origin at one of apertures of the radiation shield 10. The optical lattice has a Rayleigh length of 10 mm and a beam waist radius of about 50 μm. The geometrical shape and position of the radiation shield are designed such that interference with the laser beams for trapping and for the optical lattice is avoided. The radiation shield has two apertures; and in a conventional Sr optical lattice clock, the two apertures have diameters of, for example, $\phi1=0.5$ mm and $\phi2=1.0$ mm respectively to allow the atoms and the laser to reach inside the radiation shield, and the solid angle of both of the apertures is $\Omega_{AP}=8.9$ msr with respect to the atoms.

The radiation shield is cooled down to 95 K by, for example, a Stirling refrigerator. The inner wall surface of this radiation shield is subjected to absorptive black coating for prevention of multiple reflection of radiation at room temperature (for example, at about $T_{ext}=296(5)$ K). The hemispherical reflectance $R(\nu)$ of the black coating is about 0.02 for $\nu=27$ THz to 150 THz, and less than 0.1 for $\nu=10$ THz to 300 THz, and thus a reflectance of 0.1(1) for $\nu<10$ THz and $\nu>300$ THz is assumed. As a first analysis example of the general calculation technique described above, results obtained for a conventional radiation shield will be described first.

1-3-2. Position Dependence of BBR Shift

Figure 4A:
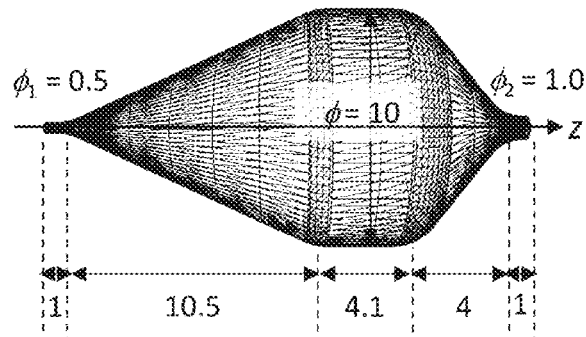
FIG. 4A to FIG. 4C are explanatory diagrams illustrating conditions for and results of calculation of position dependence of BBR shift for a conventional radiation shield.
Figure 4B:
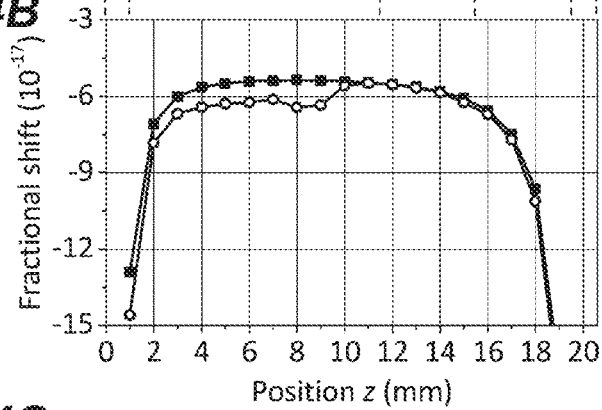
Figure 4C:
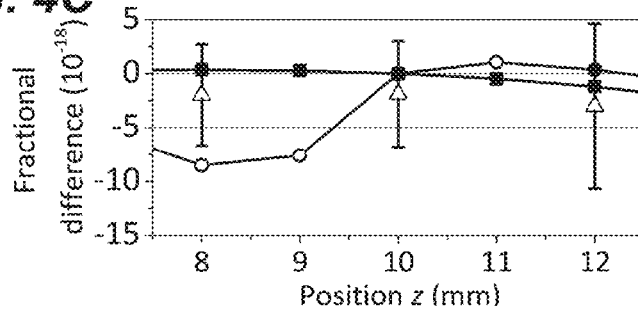

Firstly, the position dependence of BBR shift in the conventional radiation shield is calculated. FIG. 4A to FIG. 4C are explanatory diagrams illustrating conditions for and results of calculation related to the position dependence of the BBR shift for the conventional radiation shield. FIG. 4A is a rendering of a radiation shield with mesh, the radiation shield representing the conventional radiation shield described as an example and being used in the calculation. FIG. 4B is a graph illustrating results of calculation of BBR shift obtained on the assumption that the inner wall surface has a absorption coating formed thereon and has two types of residual reflection, diffuse reflection and mirror reflection. FIG. 4C is a graph illustrating the BBR shift difference at around z=10 mm from one at z=10 mm.

The radiation shield is modeled with a triangular mesh with 6350 sections as illustrated in FIG. 4A. By rounding off sharp corners of the modeled radiation shield at a radius (a fillet radius) of 2 mm, the energy conservation law was satisfied within $4\times10^{-5}$ and $7\times10^{-4}$ in total thermal radiations for diffuse reflection and mirror reflection, respectively.

In an image of 200×100 pixels representing the radiance $L_o$ (Equation 3) of each part of the inner wall surface of the radiation shield, 64 rays are traced backward from the atoms for ray tracing for each pixel, and 1000 reflections at maximum were simulated for tracing of one ray. By change of the fillet radius, and the number of meshes and number of rays, and from variation in values thereof, the uncertainties of calculated shifts for diffuse reflection and mirror reflection are able to be estimated and found to be $4\times10^{-20}$ and $2\times10^{-19}$, which correspond to fractional uncertainties of $7\times10^{-4}$ and $5\times10^{-3}$ to the total BBR shift, respectively. The position dependence is evaluated by change of the start point of the rays along the z-axis in the radiation shield of FIG. 3.

FIG. 4B illustrates results of the calculation of the BBR shift $\nu_{th}(r_a)/\nu_{Sr}$ in fractional frequency units. The clock frequency and the differential DC polarizability of Sr were $\nu_{Sr}\approx429$ THz and $\Delta\alpha(0)=4.07873(11)\times10^{-39}$ cm$^2$/V, respectively. Filled squares and open circles respectively represent the BBR shift for diffuse reflection and mirror reflection. For diffuse reflection, the position dependence due to the shape of the inner wall surface has been eliminated due to the homogeneous reflection by the inner wall surface (described later).

However, for mirror reflection, the shape of the inner wall surfaces has brought about the position dependence in the shift. The thermal radiation is concentrated in the region of z<9 mm due to the angle of the inner wall surface, and this concentration causes the enhancement of BBR shift. That is, the position dependence of the shift is prominent for mirror reflection.

The position dependence is also measured experimentally. The frequency shift is measured while the position of the atoms is changed with the temperature of the radiation shield being fixed at 95 K. The fractional BBR shift difference from the shift at 10 mm position is shown in FIG. 4C. The open triangles represent the experimentally measured BBR shift, suggesting that the contribution from mirror reflection is not dominant for the black coating adopted. The vertical error bars represent the statistical uncertainties in the measurement. The uncertainty in the position of the atoms is 1 mm. However, the relative uncertainty in the position is negligible, since the relative uncertainty is determined by the frequency detuning of the moving optical lattice. Because characterization of the BRDF of a surface for the entire wavelength range of room temperature blackbody radiation is not easy, investigation is carried out on design of a radiation shield that enables reduction of: the position dependence of the BBR shift; and the frequency shift difference between diffuse reflection and mirror reflection.

1-3-3. Reflectance Dependence of BBR Shift

Figure 5:
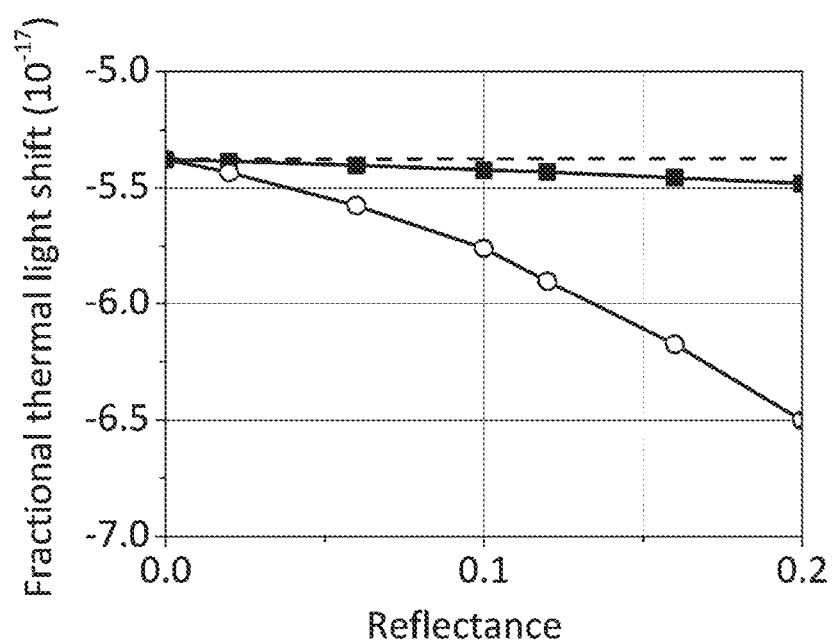
FIG. 5 is a graph illustrating calculated dependence of the BBR shift on reflectance in the conventional radiation shield.

FIG. 5 is a graph illustrating calculated dependence of the BBR shift on reflectance for diffuse reflection and mirror reflection at the center position (z=10 mm) of the conventional radiation shield. Filled squares and open circles respectively represent the reflectance dependence of the light shift for diffuse reflection and mirror reflection, respectively. The shift for the reflectance R=0 corresponds to the shift without indirect contribution from the reflection of room temperature radiation (the dash line in FIG. 5).

The shift of indirect contribution increases with the reflectance due to the multiple reflection. This increase is much more pronounced for mirror reflection than that for diffuse reflection. A reflectance increment of 0.1 causes a fractional frequency difference of $3\times10^{-18}$ between the diffuse reflection component and mirror reflection component. That is, it will be useful, if a radiation shield is able to be designed such that the frequency difference between the diffuse reflection and mirror reflection is decreased at the position of the atoms.

1-3-4. Total Uncertainty in Shift Due to Thermal Radiation

The BBR shift for thermal radiation at the temperature $T_{ext}$ is classified into two contributions, which are a direct term $\nu_{ext}^d(r_a)$ due to the radiance that the atoms are directly irradiated with from outside the radiation shield, and an indirect term $\nu_{ext}^i(r_a)$ due to the radiance reflected by the inner wall surface. The indirect shift is calculated by subtraction of the direct shift that is easily calculated, from the total shift found from Equation 3.

The indirect thermal radiation shift for the radiation shield having the black coating was found to be $-0.28\times10^{-18}$ with an uncertainty of $6\times10^{-20}$. By precise calculation of the indirect BBR shift by use of ray tracing, the uncertainty of the total BBR shift is found to be $0.82\times10^{-18}$.

1-4. Optimization Example in Geometrical Design of Radiation Shield

In the above description, the performance of the radiation shield that has been conventionally employed has been reexamined. According to an embodiment of the present disclosure, for design and optimization of a geometrical shape of a radiation shield, the above described technique where ray tracing is used is adopted. What will be described in particular is the fact that a radiation shield is able to be designed even if details of reflection characteristics of the inner wall surface of the radiation shield are still unknown, the radiation shield realizing a value that is superior to the above value of $0.82 \times 10^{-18}$, which has been found for the conventional radiation shield.

1-4-1. Tubularly, Spherically, and Confocally Shaped Radiation Shields

In this section, firstly, for study of the influence of geometrical shapes, the dependence of shift on the shapes of virtual radiation shields will be discussed based on embodiments developed by the inventors and explained as part of this disclosure. For understanding of basic characteristics of reflection inside a structure, the inventors consider simple geometrical shapes of radiation shields each having two apertures, the simple geometrical shapes being tubular, spherical, and confocal shapes. A reflectance of $R=0.1$ for the inner wall surface of each radiation shield, a cryogenic temperature of $T_{wall}=95$ K, and a room temperature of $T_{ext}=296$ K outside each radiation shield are assumed. Furthermore, each radiation shield is assumed to have two apertures of $\phi=1$ mm at both ends of the radiation shield, and a length of 20 mm.

Figure 6A:
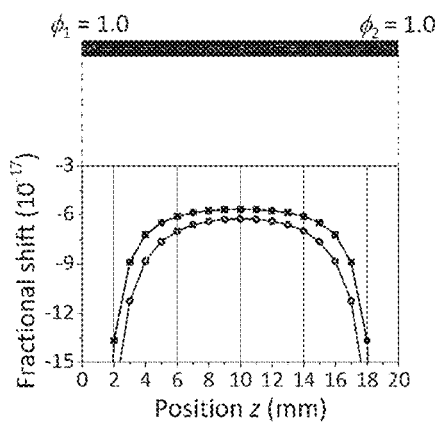
FIG. 6A to FIG. 6C are explanatory diagrams illustrating relations between shapes of various radiation shields and position dependence of BBR shift inside the radiation shields according to embodiments of the present disclosure.
Figure 6B:
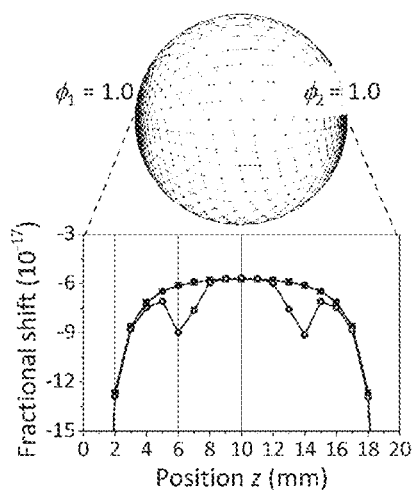
Figure 6C:
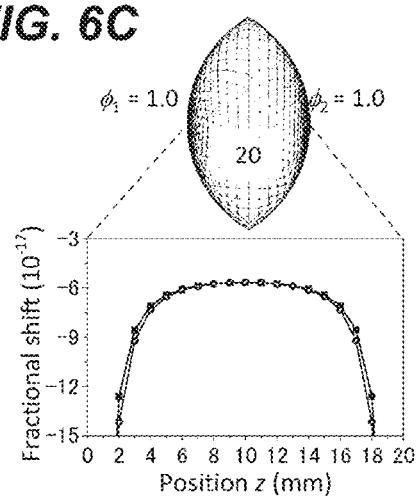

FIG. 6A to FIG. 6C are explanatory diagrams illustrating relations between shapes of various radiation shields and position dependence of BBR shift inside the radiation shields setting forth embodiments and examples as determined by the inventors as part of the present disclosure. FIG. 6A illustrates the position dependence of the shift calculated for tubular design. The BBR shift is $-5.7 \times 10^{-17}$ for diffuse reflection (filled squares) at the position z=10 mm. However, a frequency difference of $5.8 \times 10^{-18}$ arises between diffuse reflection and mirror reflection (open circles). FIG. 6B illustrates the position dependence of the shift calculated for spherical design. The frequency difference between diffuse reflection and mirror reflection (open circles) is equal to or less than $1.7 \times 10^{-18}$ in a range of position where z=8 mm to 12 mm. For mirror reflection, the shift has dips at two positions close to positions away from the center each by a distance equal to a half of the radius. These dips are caused by increased accumulation of thermal radiation due to the reflection from the spherical inner wall surface. This is expected for point light sources at the positions of the two apertures. These two apertures provided in the shield wall permit communicating to and from the hollow region with outside. Assumed for prevention of the concentration of thermal radiation near the center of the radiation shield is a confocal design where two spherical surfaces share the foci and the centers of the two spheres is located at the apertures of each other. Results of calculation are illustrated in FIG. 6C. The dips that existed for the mirror reflection in the spherical radiation shield disappeared and the shifts for diffuse reflection and mirror reflection agreed with each other within uncertainties of $6.5 \times 10^{-19}$ over a ±4 mm range around z=10 mm.

1-4-2. Optimization Guide for Radiation Shield with Actual Reflection Characteristics Adopted according to an optimization guide of an embodiment of the present disclosure is a radiation shield that enables reduction of a difference between calculated position dependence of BBR shift for diffuse reflection and calculated position dependence of BBR shift for mirror reflection at each position on a line joining apertures of the radiation shield (the position including the uncertainty of the initial position upon trapping of atoms by laser), the position being where there is a possibility that clock transition spectroscopy of the atoms will be carried out. As described above, actual black coatings have reflection characteristics that are complicated, and it is thus not easy for their reflection to be characterized over the entire wavelength region of radiation by, for example, BRDFs. However, calculation on the assumption of a perfect diffuse reflection surface following Lambert's Law and calculation on the assumption of perfect mirror reflection where there is only mirror reflection are both sufficiently realistic as indicated by the results in FIG. 4 and FIG. 5. Perfect diffuse reflection and perfect mirror reflection may be said to be two contrasting conditions where actual reflection phenomena have been idealized, and thus if geometrical design producing no difference in performance between these conditions is possible, no uncertainty should remain in the value of BBR shift that is able to be expected for a radiation shield having that geometrical design employed therefor and having an actual black coating on its inner wall surface. Even if there is a black coating, for which only its reflectance is known and its diffusivity is unable to be characterized, as long as there is no difference between the two idealized cases, which are the case where only diffuse reflection occurs and the case where only mirror reflection occurs, a real radiation shield having that black coating thereon is able to be expected to be in a range where the difference is low. If a radiation shield is made by geometrical design optimized according to this guide, for a material, such as an actual black coating, which is located on an inner surface of the radiation shield, adequate characteristics that have been predicted are realized even if the material has diffuse reflection characteristics that are not necessarily clear.

1-4-3. Optimization of Radiation Shield in Axisymmetric Design

Figure 7:
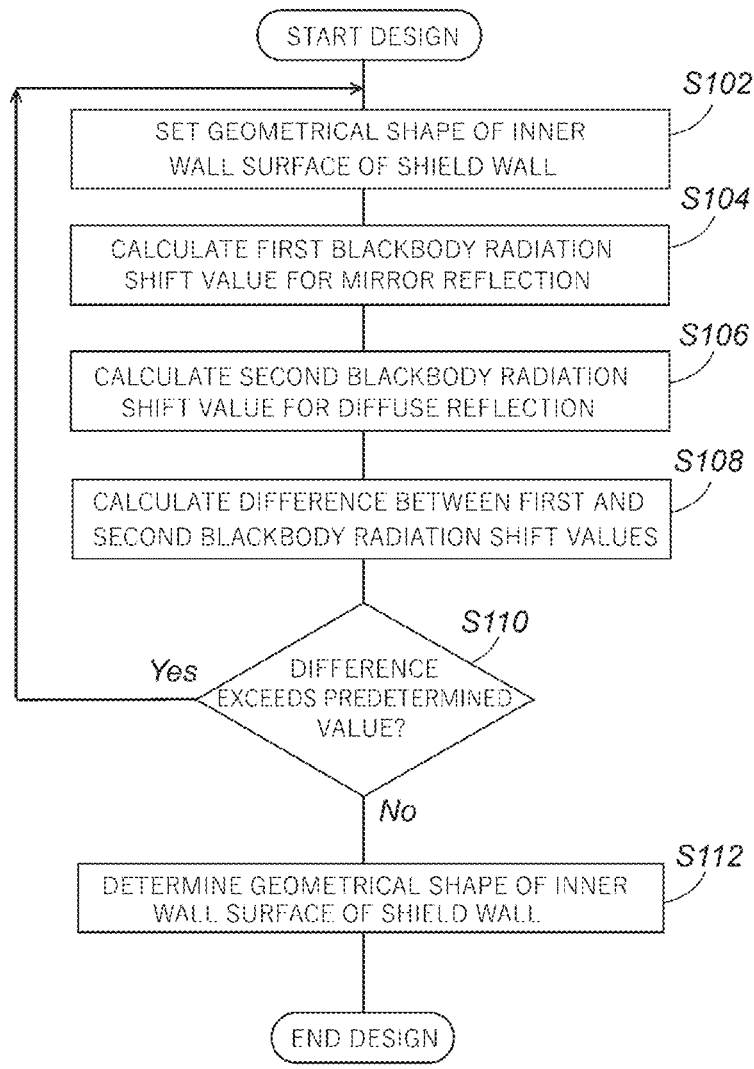
FIG. 7 is a flow chart of a design method for a radiation shield, according to an embodiment of the present disclosure.

The inventors extend the above described calculation to geometries compatible with a laser beam configuration illustrated in FIG. 3. FIG. 7 is a flow chart of a design method for a radiation shield, according to an embodiment of the present disclosure. When the radiation shield 10 (FIG. 2) with the black coating is designed for reduction of the influence of the reflection of the blackbody radiation field, it is not easy to investigate the reflection characteristics and BRDFs of the inner wall surface with the coating over all frequencies of radiation. Adopted according to this embodiment is a technique that enables a high performance radiation shield to be designed in such general circumstances. In this design, as illustrated in FIG. 7, as the initial design firstly, a geometrical shape is set for the inner wall surface (S102). This setting is preparation for ray tracing calculation, and thus is performed by an arbitrary technique that enables a shape to be defined on a computer. Subsequently, for example, by use of the reflectance R of a material actually used as the coating of the inner wall surface, BBR shift for mirror reflection is calculated (S104). This shift will be called a first BBR shift. Similarly, by use of, for example, the above mentioned reflectance R, BBR shift for diffuse reflection is calculated (S106). This value will be called a second BBR shift. Calculation of both of these shifts is possible for anywhere in the hollow region inside the radiation shield 10, but since a position where the atoms may exist upon clock transition spectroscopy, such as a position on a straight line joining the apertures, serves as a direct performance index of the radiation shield, the calculation is performed for such a position. A difference between the first BBR shift and the second BBR shift is then calculated for each position (S108). If the value of this difference exceeds a predetermined value (S110; Yes), a geometrical shape of the inner wall surface is set again. If the value of the difference does not exceed the predetermined value (S110; No), the geometrical shape at that time is adopted (S112). If, for example, $0.82 \times 10^{-18}$ is adopted as an example of the predetermined value, the designed geometrical shape may be said to have improved from the conventional radiation shield (FIG. 4). The range of position of the atoms to be assumed for the finding of the difference and the predetermined value are bases of operation conditions and design, and may thus be set freely. Furthermore, although not illustrated in the drawings, performing similar design by further requiring any additional condition is also useful. For example, designing a laser configuration for the cooling laser 4 (FIG. 2) such that no interference is caused is one of examples of such an additional condition. The performance may be improved in a progressive manner by comparison with, instead of a fixed numerical value serving as the predetermined value, the difference calculated in the design immediately before the current design, the difference serving as the predetermined value.

In an actual optical lattice clock where a radiation shield is adopted, laser-cooled atoms need to be transported into the radiation shield, with the laser-cooled atoms still being trapped in the optical lattice. During the transport, the atoms need to be appropriately trapped by the laser forming the optical lattice. Therefore, one of the apertures of the radiation shield is preferably funnel shaped and protruding to a certain extent, so as to enable laser irradiation for laser cooling. To avoid the interference between the radiation shield and cooling laser, a distance (a transport distance) from the position of laser cooling to the position of the atoms where clock transition spectroscopy is carried out in the radiation shield is preferably maintained equal to or less than 20 mm, which is roughly twice the Rayleigh length. For the atoms to be trapped in the optical lattice, the optical lattice laser is focused on a certain point to be increased in its optical intensity, but for positions away from the focus due to the increased distance of the transport, the optical lattice laser is expanded, and it becomes difficult for the trap to have sufficient optical intensity. According to this embodiment, the above described calculation technique is applied to design of a radiation shield for an actual optical lattice clock having such realistic constraints. Upon this application, a reflectance R=0.1 for the inner wall surface of the radiation shield, a distance L of 20 mm between the two apertures, and a temperature of 95 K are assumed. Furthermore, cones of the funnel shaped portions (funnel portions) are open in directions that are opposite to each other, and each has a length $L_2$ along a straight line joining the two apertures. A length $L_1$ is a length of an intermediate portion forming a cylindrical surface joining the two funnel portions, the length being along the same straight line joining the two apertures. In the optimization according to this embodiment, $L_1$ and $L_2$ are changed while a relation, $L=L_1+2L_2$, is satisfied. This symmetric shield design is based on the knowledge of reducing the BBR shift difference between diffuse and mirror reflection by the radiation shield of confocal design in section 1-4-1 comparing to the previous unsymmetric shield design in FIG. 4. Filled squares and open circles respectively represent the BBR shift for diffuse reflection and mirror reflection.

Figure 8A:
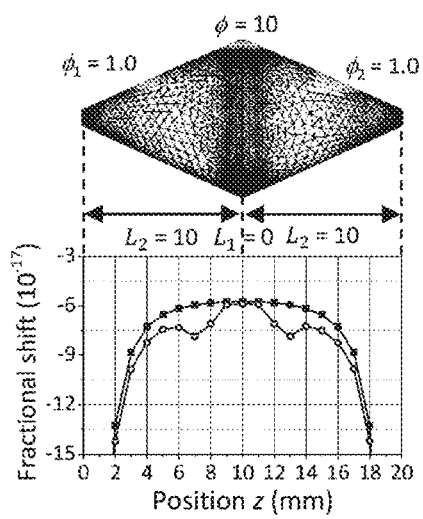
FIG. 8A to FIG. 8D are graphs illustrating position dependence of BBR shift for radiation shields designed in various geometrical shapes, with mesh models of these shapes according to embodiments of the present disclosure.
Figure 8B:
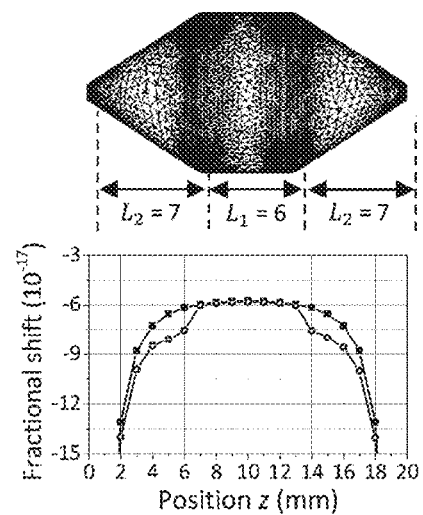
Figure 8C:
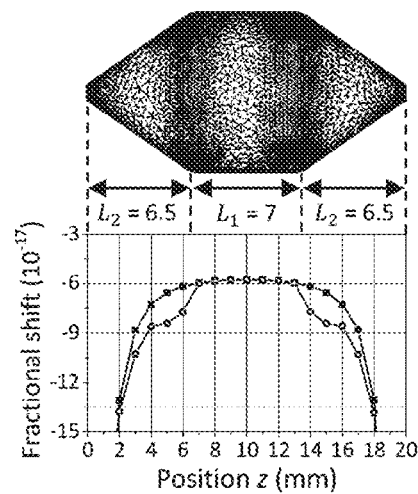
Figure 8D:
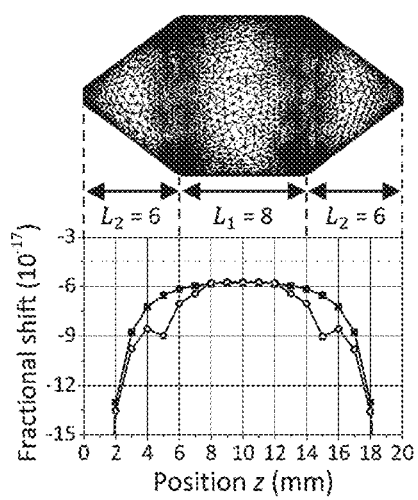
Figure 9A:
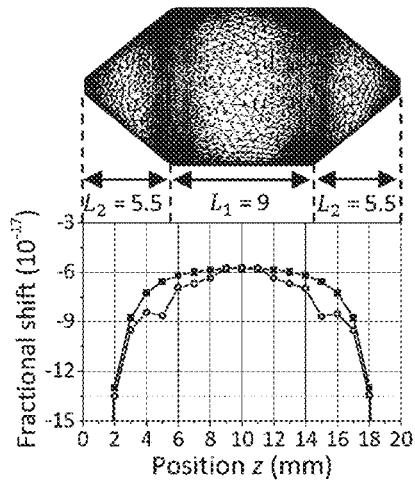
FIG. 9A to FIG. 9D are graphs illustrating position dependence of BBR shift for radiation shields designed in various geometrical shapes, with mesh models of these shapes according to embodiments of the present disclosure.
Figure 9B:
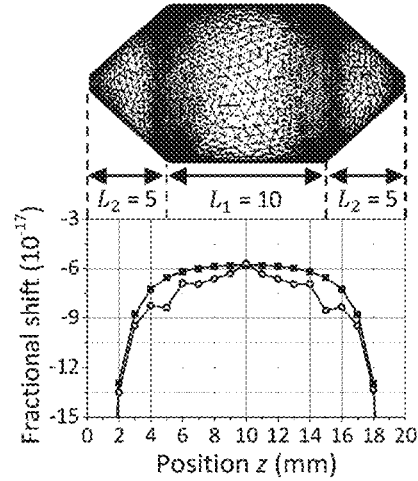
Figure 9C:
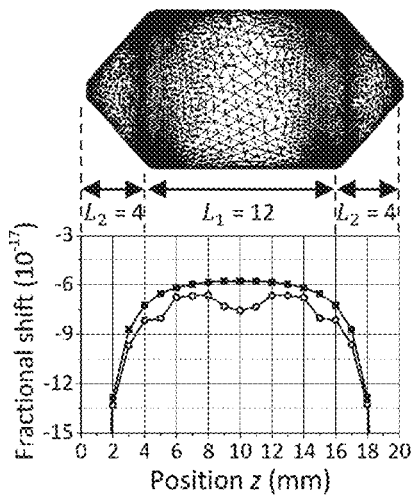
Figure 9D:
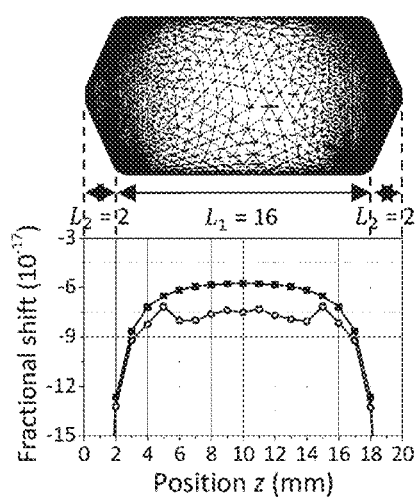

FIG. 8A to FIG. 8D and FIG. 9A to FIG. 9D are graphs illustrating position dependence of BBR shift for radiation shields designed in various geometrical shapes, with mesh models of these shapes setting forth various embodiments as part of this disclosure. In most of the designs in FIG. 8A to FIG. 8D and FIG. 9A to FIG. 9D, two dips appear for mirror reflection as described above for the spherically shaped radiation shield. The difference in shift between diffuse reflection and mirror reflection decreases as $L_1$ increases from FIG. 8A to FIG. 8C, and starts increasing due to accumulation of indirect thermal radiation near the center of the radiation shield from FIG. 8D to FIG. 9B. As $L_1$ increases further, a dip starts appearing at the center (FIG. 9C) for the mirror reflection and the curve profile starts becoming similar to that of the tubularly shaped radiation shield (FIG. 9D).

Figure 10A:
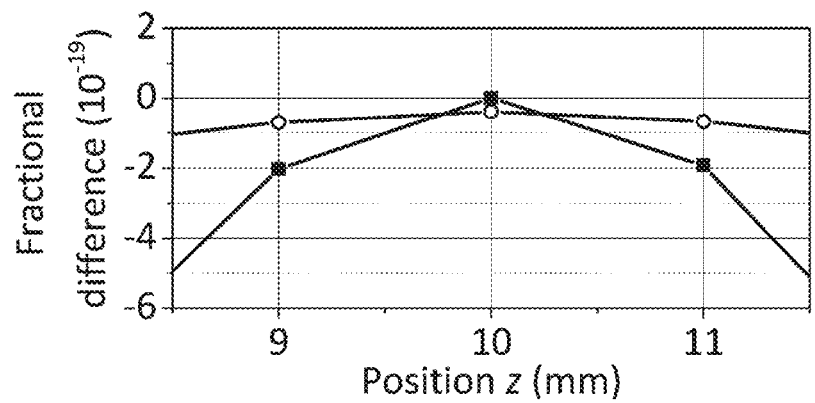
FIG. 10A to FIG. 10C are respectively graphs resulting from enlargement of FIG. 8B, FIG. 8C, and FIG. 8D according to embodiments of the present disclosure.
Figure 10B:
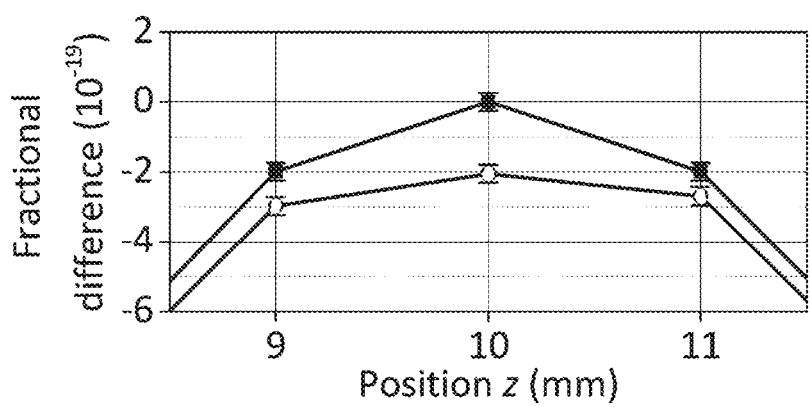
Figure 10C:
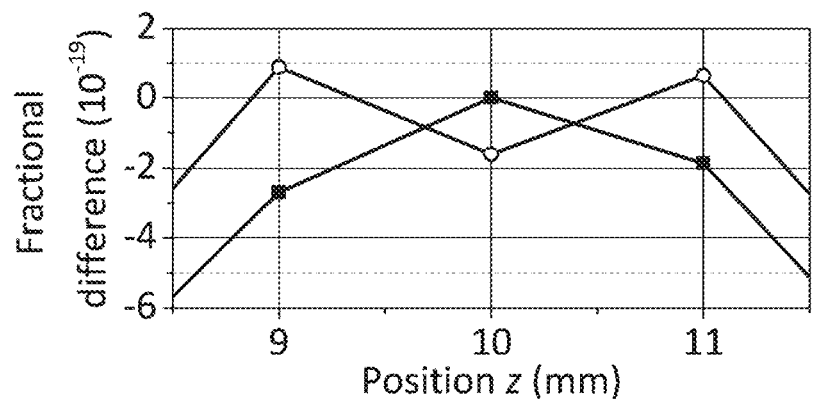

FIG. 10A to FIG. 10C respectively result from: change of vertical axes of FIG. 8A, FIG. 8C, and FIG. 8D each to the difference from the shift value at z=10 mm for diffuse reflection; and enlargement of both horizontal axes thereof and the vertical axes according to various embodiments as part of this disclosure. The position dependence of the shift is reduced to $2 \times 10^{-19}$ (FIG. 10B) near the center of the radiation shield (z=9 mm to 11 mm). That is, the difference in the shift between the diffuse reflection and mirror reflection is reduced to $2 \times 10^{-19}$ over this range. In FIG. 10A to 10C (FIG. 8B to FIG. 8D), the most preferable conditions in terms of BBR shift when the range of z is extended are the conditions in FIG. 10B (FIG. 8C) where $L_1$=7 mm and $L_2$=6.5 mm. However, from FIG. 10A to FIG. 10C, the uncertainties are maintained very small at the low $10^{-19}$ level, suggesting that there is a tolerance of about 1 mm when a radiation shield is made where $L_1$=7 mm and $L_2$=6.5 mm.

1-4-4. Application to Other Atomic Species

The calculation thus far has been calculation for Sr atoms, but the calculation may be readily extended to other atomic species, such as Yb, Mg, Cd, and Hg, which are other candidates for optical lattice clocks according to various embodiments as part of this disclosure. From an equation of spectral radiance according to Planck's Law and Equation 4, the effective solid angle is defined by the following equation.

$$\Omega^{\mathit{eff}}(T) = \int_{\Omega_{ra}} L_i(r_a, T, e_i) d\Omega_{ra} / L_r(T). \tag{6}$$

A static term $\nu_{stat}$ is the contribution from the BBR shift at a temperature $T_0$=300 K caused by the differential static polarizability between the two states, the ground state and excited state of clock transition, and a dynamic term $\nu_{dyn}$ is the contribution from the BBR shift at the temperature $T_0$ due to the variation of differential polarizability according to the frequency range of the BBR spectrum. By use of $\nu_{stat}$ and $v_{dyn}$ for correction, the BBR shift including indirect thermal radiation is expressed by the following equation.

$$v(r_a) = a(T_{ext}/T_0)^4 + b(T_{ext}/T_0)^6 + e(T_{wall}/T_0)^4 + d(T_{wall}/T_0)^6, \quad (7)$$

In Equation 7, $a = v_{stat}\Omega_{eff}(T_{ext})/4\pi$, $d = v_{dyn}\Omega_{eff}(T_{ext})/4\pi$, $c = v_{stat}\Omega_{eff}(T_{wall})/4\pi$, and $d = /V_{dyn}\Omega_{eff}(T_{wall})/4\pi$, and in the geometrical design of FIG. 8C, $\Omega_{eff}(T_{ext}) = 18.4$ msr, and $\Omega_{eff}(T_{wall}) = 12.548$ sr.

For Sr and Yb atoms, $v_{stat}$ and $v_{dyn}$ have been investigated both experimentally and theoretically. For Mg, Cd, and Hg atoms, $v_{stat}$ has been investigated theoretically. Table 1 summarizes contributions for the respective atoms at temperatures $T_1$ and $T_2$. The BBR shift is calculated by use of these coefficients. Table 1 lists therein BBR shift coefficients for the different atomic species, the BBR shift coefficients being calculated by use of the ray tracing method by adoption of the geometrical design in FIG. 8C for the radiation shield.

TABLE 1

| Atom | a(10^18) | b(10^18) | c(10^18) | d(10^18) |
|------|----------|----------|----------|----------|
| Sr | −7.3 | −0.5 | −4955.6 | −344.3 |
| Yb | −3.6 | −0.1 | −2417.6 | −41.8 |
| Mg | −0.6 |  | −394.8 |  |
| Cd | −0.4 |  | −291.9 |  |
| Hg | −0.2 |  | −160.1 |  |

2. Conclusion

The inventors of this patent application calculated, based on a ray tracing model, light shift induced by thermal radiation for optical lattice clocks having cryogenic radiation shields. The shift for a number of radiation shield configurations was calculated, and it has been found that there is a frequency difference of the $10^{-17}$ level between two types of reflection (perfect diffuse reflection and perfect mirror reflection) due to spatial inhomogeneity of BBR shift arising from multiple reflection of thermal radiation.

The inventors designed an optimal and practical radiation shield that enabled reduction of uncertainty of the shift to $2 \times 10^{-19}$ for an atom position uncertainty of ±1 mm for the two different types of reflection. This design enables reduction of the frequency difference in shift between diffuse reflection and mirror reflection to less than $2 \times 10^{-19}$. The design is readily applicable to cryogenic optical lattice clocks having other atomic species used therein. The new design opens up the possibility of atomic clocks of the $10^{-19}$ level.

Hereinbefore, embodiments of the present disclosure have been described specifically. The above described embodiments, modifications of the embodiments, and examples have been described for explanation of the disclosure disclosed in this patent application, and the scope of the disclosure of this patent application should be determined based on the statements of the claims of the patent. Modifications within the scope of the present disclosure, including any other combination of the embodiments, are also included in the scope of the claims.

INDUSTRIAL APPLICABILITY

The present disclosure is usable as a radiation shield of an optical lattice clock for time measurement, and for any sort of atomic clocks equipped with the radiation shield.

REFERENCE LIST

100 OPTICAL LATTICE CLOCK
2 ATOM
4 COOLING LASER (ATOM COOLING LASER)
6 OPTICAL LATTICE LASER
62 MODULATION ELEMENT
8 CLOCK LASER (CLOCK TRANSITION SPECTROSCOPY LASER)
10 RADIATION SHIELD
20 VACUUM CHAMBER

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A radiation shield, comprising:
   a shield wall surrounding a hollow region configured to accommodate therein atoms for an optical lattice clock, the shield wall having an inner wall surface; and
   at least two apertures provided in the shield wall that permit communicating to and from the hollow region with outside, wherein
   a geometrical shape of an inner wall surface of the shield wall is configured such that a difference between blackbody radiation (BBR) shifts found under two conditions does not exceed a predetermined value at each position of the atoms, wherein the geometrical shape is an axisymmetric shape around a straight line connecting the at least two apertures and the geometrical shape includes:
      a first funnel portion forming a conical surface having a vertex at one of the two apertures;
      a second funnel portion forming a conical surface having a vertex at the other one of the two apertures; and
      an intermediate portion forming a cylindrical surface joining the first funnel portion and second funnel portion.

2. The radiation shield of claim 1 wherein the BBR shifts being caused in clock transition of the atoms by the radiation emitted by the inner wall surface, incoming radiation leaking in from the outside through the apertures, and a reflection component of the emitted radiation and incoming radiation at the inner wall surface, the two conditions being a condition where the inner wall surface exhibits mirror reflection and a condition where the inner wall surface exhibits diffuse reflection, each position being where clock transition operation is carried out in the optical lattice clock, the inner wall surface facing the hollow region.

3. The radiation shield according to claim 1, wherein the predetermined value is $0.82 \times 10^{-18}$.

4. The radiation shield according to claim 1, wherein lengths $L_2$ of the first funnel portion and the second funnel portion along the straight line are each ¾ to ⅞ times of a length of the intermediate portion along the straight line.

5. The radiation shield according to claim 1, wherein the geometrical shape is an inversion symmetric shape.

6. The radiation shield according to claim 1, wherein the inner wall surface has a reflectance equal to or less than 0.1.

7. The radiation shield according to claim 1, wherein
the atoms for the optical lattice clock are any one selected from the group consisting of Sr atoms, Yb atoms, Mg atoms, Cd atoms, and Hg atoms, and
the inner wall surface of the shield wall is configured such that a difference between a mirror reflection blackbody radiation shift and a diffuse reflection blackbody radiation shift imparted, both by a radiation field through the apertures and from the outside at 300 K, to the atoms upon operation thereof becomes equal to or less than $10^{-18}$.

8. An optical lattice clock, comprising the radiation shield according to claim 1.

9. A design method for a radiation shield having a shield wall surrounding a hollow region capable of accommodating therein atoms for an optical lattice clock, the shield wall having, provided therein, at least two apertures communicating with outside, the design method comprising:
a mirror reflection calculation step of finding, for each position of the atoms, a first BBR shift that is a Stark shift caused in the atoms by the radiation emitted by an inner wall surface facing the hollow region, incoming radiation leaking in from the outside through the apertures, and a reflection component of the emitted radiation and incoming radiation at the inner wall surface, under a condition where the inner wall surface exhibits mirror reflection, the each position being where clock transition spectroscopy is carried out in the hollow region;
a diffuse reflection calculation step of finding, for each position of the atoms, a second BBR shift that is a Stark shift caused in the atoms by the radiation emitted by the inner wall surface, incoming radiation leaking in from the outside through the apertures, and a reflection component of the emitted radiation and incoming radiation at the inner wall surface, under a condition where the inner wall surface exhibits diffuse reflection, the each position being where clock transition spectroscopy is carried out in the hollow region; and
a step of finding, for each position, a difference between the first blackbody radiation shift value and the second blackbody radiation shift value, wherein
determining a geometrical shape of the inner wall surface of the shield wall such that the difference does not exceed a predetermined value at each position of the atoms, the each position being where clock transition spectroscopy is carried out in the optical lattice clock.

10. The design method for the radiation shield, according to claim 9, wherein the BBR shift is calculated using a ray tracing method in at least one of the mirror reflection calculation step and diffuse reflection calculation step.

11. A radiation shield, comprising:
a shield wall surrounding a hollow region configured to accommodate therein atoms for an optical lattice clock, the shield wall having an inner wall surface; and
at least two apertures provided in the shield wall that permit communicating to and from the hollow region with outside, wherein
a geometrical shape of an inner wall surface of the shield wall is configured such that a difference between blackbody radiation (BBR) shifts found under two conditions does not exceed a predetermined value at each position of the atoms, and
the geometrical shape includes:
a first partial spherical surface having a radius equal to a distance between the two apertures and having one of the two apertures at the center of the first partial spherical surface; and
a second partial spherical surface having a radius equal to the distance and having the other one of the two apertures at the center of the second partial spherical surface.

* * * * *